US006472683B1

(12) United States Patent
Li (10) Patent No.: US 6,472,683 B1
(45) Date of Patent: Oct. 29, 2002

(54) SEMICONDUCTOR QUANTUM OSCILLATION DEVICE

(76) Inventor: Binghui Li, 1216 E. Vista Del Cerro #1057, Tempe, AZ (US) 85282

(*) Notice: Subject to any disclaimer, the term of this patent is extended or adjusted under 35 U.S.C. 154(b) by 0 days.

(21) Appl. No.: 09/402,709
(22) PCT Filed: Mar. 23, 1998
(86) PCT No.: PCT/CN98/00049
§ 371 (c)(1),
(2), (4) Date: Oct. 8, 1999
(87) PCT Pub. No.: WO98/45882
PCT Pub. Date: Oct. 15, 1998

(30) Foreign Application Priority Data

Apr. 10, 1997 (CN) .......................................... 97110353 A (51) Int. Cl.⁷ ............................................... H01L 29/06
(52) U.S. Cl. ......................................................... 257/25
(58) Field of Search ........................................... 257/25

(56) References Cited

U.S. PATENT DOCUMENTS

| 3,626,257 A | | 12/1971 | Esaki et al. | |
| 3,626,328 A | | 12/1971 | Esaki et al. | |
| 4,667,211 A | * | 5/1987 | Iafrate et al. | 357/4 |
| 5,132,746 A | * | 7/1992 | Mendez et al. | 357/4 |

OTHER PUBLICATIONS

Tsai et al. P–N Double Quantum Well Resonant Inteband Tunneling Diode with Peak–to–Valley Current Ratio of 144 at Room Temperature, IEEE Electron Device Letters, vol. 15, 1994, pp. 357–359.*
Leo, Interband Optical Investigation . . . 2OCT97.
Muller, Proposal for Terahertz Zener Oscillator, 1984.
Roblin Time–Dependent Tunnelling 1986.

* cited by examiner

Primary Examiner—Olik Chaudhuri
Assistant Examiner—Douglas A. Wille
(74) Attorney, Agent, or Firm—Parsons & Goltry; Robert A. Parsons; Michael W. Goltry (57) ABSTRACT

A semiconductor quantum oscillation device, which realizes Bloch oscillation on the basis of a novel carrier injection scheme, comprises a multilayer semiconductor structure and a means for applying a voltage to said structure. The multilayer structure comprises a tunneling injection region and a pair of oscillation regions which are located on both sides of the tunneling injection region and adjacent to it. The voltage applied across the tunneling region and the pair of oscillation regions causes valence electrons to enter into the conduction band through interband tunneling in the tunneling injection region and leads to electrons and holes being injected into the pair of oscillation regions, respectively. The electrons and holes injected this way undergo quantum oscillation motion and produce far-infrared radiation. The device of the present invention will pave the way for effectively utilizing the electromagnetic spectral resource between the high-end of millimeter-wave and the low-end of far infrared.

24 Claims, 6 Drawing Sheets

SEMICONDUCTOR QUANTUM OSCILLATION DEVICE

FIELD OF INVENTION

This invention relates to quantum effect semiconductor devices and more particularly, to semiconductor quantum oscillation (Bloch oscillation) devices, which produce electromagnetic radiation in response to an applied electric field. The frequency of the electromagnetic radiation is between the highest microwave frequencies and the lowest infrared frequencies.

BACKGROUND OF INVENTION

The basic physical principle involved in the present invention is the dynamics of electrons in a crystal subjected to a uniform electric field. Sixty year ago, F. Bloch (F. Bloch, Z. Phys. 52, 555(1928)) and C. Zenner (C. Zenner, Proc. R. Soc. 145, 523 (1934)) have shown that an electron in a crystal could be described as a wave-packet composed of Bloch functions, and in the case where both scattering and interband tunneling into higher energy bands are absent, the electron will undergo periodic motion in k space in response to the applied electric field. The frequency of the periodic motion is $eFa/h$, where e is the electron charge, F is the electric field, a is the crystal constant, and h is the Plank constant. The oscillatory motion of an electron in k space is accompanied by a periodic motion in real space. This oscillatory motion of electrons in a crystal subjected to a uniform electric field is generally termed Bloch oscillation (or alternately Zenner oscillation, or Zenner-Bloch oscillation or Bloch-Zenner oscillation). Bloch oscillation is caused by the Bragg reflection of ballistically accelerated electrons at the Brillouin zone boundary, which leads to the periodic motion of electrons in the first Brillouin zone. The above description of electron motion is based on the dynamics of Bloch wave packet and is generally called a quasi-classical description. Subsequent theoretical work has shown that, an electron in a crystal subjected to a uniform electric field could also be described as a wave packet composed of quasibound Wannier-Stark states. In this fully quantum-mechanical description, Bloch oscillation appears as a special case of the quantum interference of Wannier-Stark states. For a detailed theoretical analysis of Bloch oscillation, the paper titled "Warrier-Stark Quantization and Bloch Oscillator" by G. Bastard and F. Ferreira could be consulted (in Spectroscopy of Semiconductor Microstructure, NATO ASI series, Plenum, N.Y., 1989, P.333). In order to realize Bloch oscillation, electrons should complete at least one oscillation period before being excited into higher energy bands (via interband tunneling sometimes called Zenner tunneling) or before experiencing scattering. For interband tunneling, when phonon effects are neglected, its upper boundary has been established at a rigorous level based on one-electron theory approximation, which shows that an electron may execute a number of Bloch oscillations before tunneling out of a band (A. Nenciu and G. Ninciu, J. Phys. A14, 2817(1981)). Therefore, interband tunneling should not be an obstacle to the realization of Bloch oscillation. As to scattering, there are two scattering mechanisms for electron in a solid, including phonon scattering and impurity scattering. Now, it is a common belief that due to the existence of scattering, Bloch oscillation should not be observable in conventional solid for all reasonable values of electric fields (G. von Plessen and P. Tomas, Phys. Rev. 45, 9185(1992)). P. Robin and M. W. Muller (J. Phys. C: Solid State Phys. 16, 4547(1983)) studied the properties of Bloch oscillation (called coherent Zenner oscillation in their paper) and found that only quasicohorent electrons can execute Bloch oscillation. Quasicohorent electrons are classical-like electron with minimized size x, and an oscillatory position expectation.

From an application standpoint, L. Esaki and R. Tsu proposed in their U.S. Pat. (No. 3,626,328) a Bloch oscillation device that employs a superlattice structure. The starting point for their proposed device is that the condition needed for Bloch oscillation should be more easily satisfied in superlattice structures. The argument is that a mini-Brillouin zone much smaller in width than the normal Brillouin zone is formed in the superlattice direction and as a result the scattering processes might be more favorable than in conventional solids. The objective of this invention is to provide a high-frequency semiconductor superlattice bulk oscillator based on the physical principle of Bloch oscillation. Up to now, the proposed device has never being realized (L. Esaki, in Science and Technology of Mesoscopic Structures, Springer-verlag, 1992, P.3). M. W. Muller, P. Robin and D. I. Rode (Workshop on Submicron devices Physics, ed. H. L. Grubin, (New York: plenum, 1983), P. 261) proposed a concept bulk semiconductor Bloch oscillation device. In this device, time-dependent intra-band tunneling of electrons from a narrow band-gap semiconductor into a wide band-gap semiconductor is suggested as the injection scheme. P. Robin and M. W. Muller (Semicond. Sci. Technol. 1, 218 (1986)) recognized that electrons must be injected in phase to realize Bloch oscillation. They also made a qualitative analysis on the scattering of Bloch oscillation (called Zenner oscillation in their paper) and pointed out that the polar scattering in a semiconductor such as GaAs could be tuned out if the frequency of Bloch oscillation is lager than the maximum longitudinal optical phonon frequency. In addition, they further realized that the primary difficulty with the Bloch oscillations (Zenner oscillations) in bulk semiconductors is to turn them on. Though all their above viewpoints regarding to realizing Bloch oscillation are correct and are very insightful, they came to a conclusion that one could not escape the high polar scattering rate during the electron injection phase. Their concept Bloch oscillation device does not become a working device. The reason is that the time-dependent tunneling electron injection scheme proposed in their device is not practical, and in addition this electron injection scheme could not escape the polar scattering. Therefore, the key to obtain practical Bloch oscillation becomes how to find a novel electron injection scheme, which could not only escape the polar scattering but also make the injected electrons in phase. Besides, the above semiconductor Bloch oscillation devices are concentrated on electrons in the conduction band, and little is reported on how to realize Bloch oscillation using the other type carriers, i.e. holes in the valence band.

SUMMARY OF THE INVENTION

It is among the objects of the present invention to provide a semiconductor Bloch oscillation device that employs a unique carrier injection scheme to inject carriers (including conduction band electrons and valence band holes). The carrier injection scheme provided will not only overcome the high polar scattering obstacle unresolved in prior art, but also inject both coherent electrons and coherent holes. In order to implement the above objectives, the present inventor made a broad and detailed study on the conditions required to realize Bloch oscillation and the following facts pertaining to Bloch oscillation are discovered:

1). Valence electrons in the full valence band of an intrinsic semiconductor experience much less scattering in comparison with conduction-band electrons and valence band electrons (represented as holes) in doped semiconductors. The argument is that, if these valence electrons experience phonon scattering, the only possible way of being scattered is into the conduction band, as there are no available states in the full valence band. And in reality, the probability of this kind of scattering is extremely small as the band gaps of common semiconductors are usually much larger than the energy of thermal phonons.

2). Under the action of a strong electric field, band-edge valence electrons (wave vector k nearly equal zero) of an intrinsic (unintentionally doped) semiconductor could be excited into the conduction band through the interband tunneling process, so it is possible to obtain free electrons and free holes in the conduction and valence bands, respectively. Based on the discovery in 1), band-edge valence electrons in a full valence band experience little phonon scattering before the occurring of interband tunneling. Therefore, if phonon participation is being avoided for the interband tunneling process (direct interband tunneling), then the free electrons and free holes obtained will escape the influence of phonons. Considering that only the band-edge valence electrons with a wave vector of nearly zero take part in the interband tunneling process, and that a wave vector is conserved for the phonon-free interband tunneling process, it will be possible to obtain coherent free electrons and free holes by making interband tunneling occur only locally 3). Based on P. Robin and M. Mullers analysis on the scattering of Bloch oscillation (cited above), in order to tune out phonon scattering, an electric field more than 1000 KV/cm is needed to make the frequency of Bloch oscillation higher than the frequency of longitudinal optical (LO) phonons. This requirement of the electric field to tune out scattering is in agreement with the requirement to induce direct interband tunneling in semiconductors.

4). Now Molecular Beam Epitaxy (MBE), Metal-Organic Chemical Vapor Deposition (MOCVD) or other material growth methods with the capability of atomic layer control is widely used to grow various types of semiconductor multilayer structures. By controlling the thickness, composition and/or stress of each individual layer, it is possible to make direct interband tunneling occur only locally inside the multilayer structure when the whole multilayer structure is subjected to a strong electric field. The region where interband tunneling occurs can be used as the injection region for Bloch oscillation devices to obtain coherent electrons and coherent holes.

Based on the above discoveries, the present invention provides a semiconductor quantum (Bloch) oscillation device including a multilayer structure of semiconductor heterojunction material defining an interband tunneling region with a pair of carrier oscillation regions sandwiching the interband tunneling region therebetween and means for applying an operating voltage across the multilayer semiconductor structure. The operating voltage applied across the multilayer structure inducing interband tunneling of carriers in the interband tunneling region and injecting coherent carriers into the carrier oscillation regions. The device employs direct (phonon-free) interband tunneling (also called Zenner tunneling) to implement coherent electron and coherent hole injection into the pair of carrier oscillation regions, and the interband tunneling is made to occur only locally in an intrinsic or unintentionally doped semiconductor multilayer structure.

It is very difficult to build a practical oscillator using existing two-or three terminal semiconductor devices to produce electromagnetic radiation with a frequency of above 300 GHz. On the other hand, for spectral regions above mid-infrared (5–8 um), there are no solid light sources available that could directly and efficiently convert electric energy into optical energy similar to a near-infrared laser. All in all, in the spectral region from mid-infrared to the sub-millimeter region, there is a significant need for an efficient, lightweight and high-speed optical source. The frequency of Bloch oscillation covers this spectral region. Therefore, the semiconductor quantum (Bloch) oscillation device provided by the present invention will pave the way for effectively using the electromagnetic resource in this spectral region.

DETAILED DESCRIPTION

Figure 1:
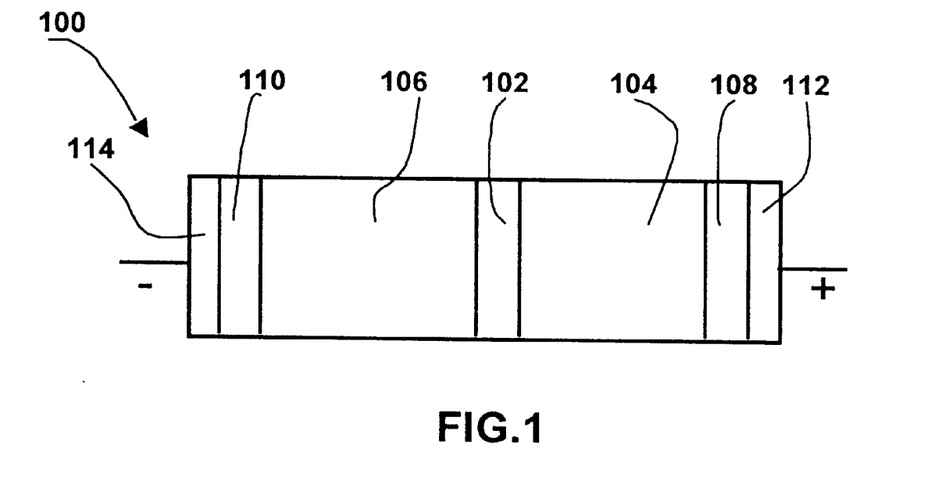
FIG. 1 is a diagram illustrating the structure of the semiconductor quantum oscillation device according to the invention in which direct interband tunneling is used to realize carrier injection.

FIG. 1 is a diagram illustrating the structure of the semiconductor quantum oscillation device of the present invention that comprises an interband tunneling region and two carrier oscillation regions. The entire device is designated 100 and is shown to include an interband tunneling injection region 102; two carrier oscillation regions, electron oscillation region 104 and hole oscillation region 106, which sandwich interband tunneling injection region 102; one contact region 108 which is adjacent to electron oscillation region 104 and a corresponding metal electrode 112 formed on it; and another contact region 110 which is adjacent to hole oscillation region 106 and a corresponding metal electrode 114 formed on it. While operating the device, a positive voltage applied to metal electrodes 112 and 114 produces a strong electric filed in interband tunneling injection region 102 and carrier oscillation regions 104 and 106. The strong electric field induces direct (phonon-free) interband tunneling in interband tunneling injection region 102 which leads to coherent electrons and coherent holes being injected into electron oscillation region 104 and hole oscillation region 106, respectively. The injected coherent electrons and coherent holes execute Bloch oscillation in response to the strong electric field in the oscillation regions by the interaction of the coherent carriers in the oscillation regions with the crystal periodic potential and produce electromagnetic radiation. The electromagnetic wave output is perpendicular to the applied electric field, with the electric field polarization being along the direction of the applied electric field. The semiconductor quantum device of the present invention looks likes an edge-emitting semiconductor light-emitting diode (LED), though the working principles involved are quite different. Therefore, by forming a waveguide-type Fabray-Perot resonant cavity, similar to an ordinary semiconductor injection laser, or by employing other techniques to couple the radiation energy back into the device, the semiconductor quantum oscillation of the present invention can be operated as a laser.

The frequency of Bloch oscillation of carriers can be expressed as $$\nu = \lambda 2\pi eF/h\kappa \quad (1)$$

where e is the electron charge, F is the electric field, h is the Plank constant, $\kappa$ is the "diameter" of the Brillouin zone along the electric field direction, and $\lambda$ is a numerical factor related to the detailed energy band structure of the oscillation region. For GaAs and some other compound semiconductors, the conduction band minimum is located at the center of the Brillouin zone ($\Gamma$ point, $\kappa=0$), while the conduction band also has satellite valleys along the <100> and <111> crystal directions. Based on the quasiclassical description of electron motion, the frequency of the Bloch oscillation could not be calculated using the simplified formula ($\nu=2\pi eF/h\kappa$) derived for the case in which only one energy extreme exists. Therefore, $\lambda$ is introduced to account for the actual band structure effects. Though at present it is not very clear how the band structure affects the frequency of Bloch oscillations, it is expected that $\lambda$ has a value of 1 to 2. For the valence band of most semiconductors, as there are no sub-extremes, $\lambda$ has a value of 1. For GaAs, supposing that an electric field of $5\times10^5$ V/cm is applied along the <100> crystal direction, it can be determined that $h\nu=27 \lambda$ meV based on equation (1). It can be seen that electromagnetic radiation from the Bloch oscillation is in the far-infrared region in this case.

Metal electrodes 112 and 114 in FIG. 1 are the terminals which access the outside world for the semiconductor quantum oscillation device of the present invention. Basically, metal electrodes 112 and 114 have two functions: one is that the voltage applied to them produces the strong electric field needed for device operation in interband tunneling injection region 102 and carrier oscillation regions 104 and 106; and the other is that they act as two collectors to collect the dephased electrons and the dephased holes from carrier oscillation regions 104 and 106, respectively. A coherent carrier that executes Bloch oscillation will become dephased once it experiences a phase-breaking scattering event such as phonon-scattering. The current formed by the dephased carriers forms the external terminal current for the semiconductor quantum oscillation device 100 of the present invention. It is significant to point out that, for semiconductor quantum oscillation device 100 of the present invention, there are two requirements for metal electrodes 112 and 114. The requirements are that electrode 112 should not inject non-coherent electrons into electron oscillation region 104 while electrode 114 should not inject non-coherent holes into hole oscillation region 106. If the above requirements can not be met, avalanche breakdown induced by the injected non-coherent carriers from the electrodes will precede the required interband tunneling and make it impossible to achieve coherent carrier injection. Depositing metal electrodes 112 and 114 directly on the significantly undoped carrier oscillation regions 104 and 106 is not an easy way to meet the above requirements as non-coherent carrier injection could occur just like in a reverse biased Schottky diode. It is also impractical to insert a dielectric layer between the contact metal and the undoped carrier oscillation regions to prevent non-coherent carrier injection from the metal electrode. The reason is that surface states exist on the interface between the undoped semiconductor and the dielectric layer, and these surface states will act as carrier generation centers if an electric filed exists on the interface, and non-coherent carriers are injected into the carrier oscillation region. Even this method is viable by reducing the surface state density to near zero, however, the device could only operate in pulse mode. An effective means to prevent non-coherent carrier injection from the contact electrodes is to insert a semiconductor contact region between the carrier oscillation region and the contact electrode, i.e., contact region 108 is inserted between electron oscillation region 104 and metal electrode 112 and contact region 110 is inserted between hole oscillation region 106 and metal electrode 114 in FIG. 1. Preferably, the contact between metal electrodes 112 and 114 and semiconductor contact regions 108 and 110 is an ohmic contact. An ohmic contact is not a necessity for the semiconductor quantum oscillation device of the present invention, but is believed to give best results. Opposite conductivity types are provided for semiconductor contact regions 108 and 110 i.e., contact region 112 adjacent to electron oscillation region is doped n-type and contact region 114 adjacent to hole oscillation region is doped p-type. Summarizing, the preferred overall structure of the semiconductor quantum oscillation device of the present invention resembles a reverse biased P-I-N diode, and the uniqueness is that the I region comprises an interband tunneling region and two carrier oscillation regions made of a multilayer semiconductor structure having a predetermined composition and bandgap profile. It is worthwhile to point out that if the two semiconductor contact regions are made having the same conductivity type (corresponding structures are N-I-N or P-I-P), it will be impossible to prevent non-coherent carriers from being injected into the carrier oscillation regions from the contact electrodes.

Figure 2:
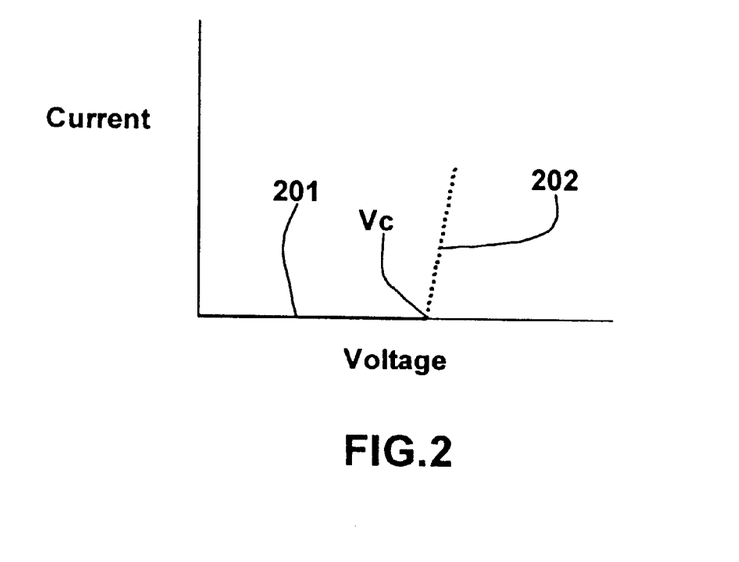
FIG. 2 is a plot of the I-V characteristics for the semiconductor quantum oscillation device in FIG. 1, illustrating that there is a critical voltage Vc corresponding to the occurrence of interband tunneling.

FIG. 2 is a plot illustrating the I-V characteristics of semiconductor quantum oscillation device 100 shown in FIG. 1. There is a breakdown voltage which corresponds to the occurrence of interband tunneling, and this breakdown voltage is designated critical voltage Vc. When the applied external voltage is lower than critical voltage Vc, no current exists in the device, and this portion of the I-V plot is shown in FIG. 2 as segment 201. When the applied external voltage is larger than the critical voltage Vc, coherent carriers injected into carrier oscillation regions 104 and 106, through interband tunneling, execute Bloch oscillation and emit electromagnetic radiation. While executing Bloch oscillation, some of the coherent carriers lose phase coherence due to scattering and become dephased carriers. Contact regions 108 and 110 collect these dephased carriers, and the resulting current is the terminal current of device 100 and is shown as segment 202 in FIG. 2. It is emphasized that, for semiconductor quantum oscillation device 100, both coherent and non-coherent carriers are involved and the overall carrier system (carrier ensemble) is in a state far from thermal equilibrium. This feature is quit distinctive from all available ordinary semiconductor device where carriers as a system are either in a thermal equilibrium state with the host crystal (low field case) or in a state of thermal equilibrium but with a higher temperature than the host crystal (high-field case). As a results of the non-equilibrium nature of the carrier system for semiconductor quantum oscillation device 100, the I-V characteristics of the device will depend on the measurement methods used. Segment 202 in FIG. 2 is drawn as a dashed line to reflect this feature of the device. Besides, the coherent electrons and coherent holes are localized in space while executing Bloch oscillations, and as a result a space charge effect arises. Another factor, which affects the I-V characteristics of semiconductor quantum oscillation device 100, is the optical field which exists inside the device. It should be understood that the feedback effects of the space charge effect and the optical field on device operation will make the actual I-V characteristics more complex than that shown in FIG. 2. However, the fact that there is a critical voltage corresponding to the occurrence of interband tunneling still persists. For the normal operation of semiconductor quantum oscillation device 100, the applied voltage is higher than critical voltage Vc. An I-V characteristic obtained from an exemplary device is illustrated and explained in a later part of this application.

The active regions of semiconductor quantum oscillation device 100 of the present invention are interband tunneling injection region 102 and two carrier oscillation regions 104 and 106. This division of the active regions of device 100 is only for the convenience of description. In fact, interband tunneling region 102 and carrier oscillation regions 104 and 106 are adjacent and can only implement their individual functions as they are combined together. How these three regions as a whole are realized for the device shown in FIG. 1 will be described below in the form of energy band diagrams. Regions 102, 104 and 106 are generally made of an undoped or intrinsic multilayer semiconductor structure having a predetermined composition and bandgap profile. Undoping or intrinsic composition is a necessity for the device active region. Only by using an undoped or intrinsic structure, is it possible to obtain the strong electric filed required to achieve coherent carrier injection through direct interband tunneling and Bloch oscillation. It should be understood that the energy band gap illustrated in the band diagrams below is the direct bandgap at the Brillouin zone center (Γ point).

Figure 3:
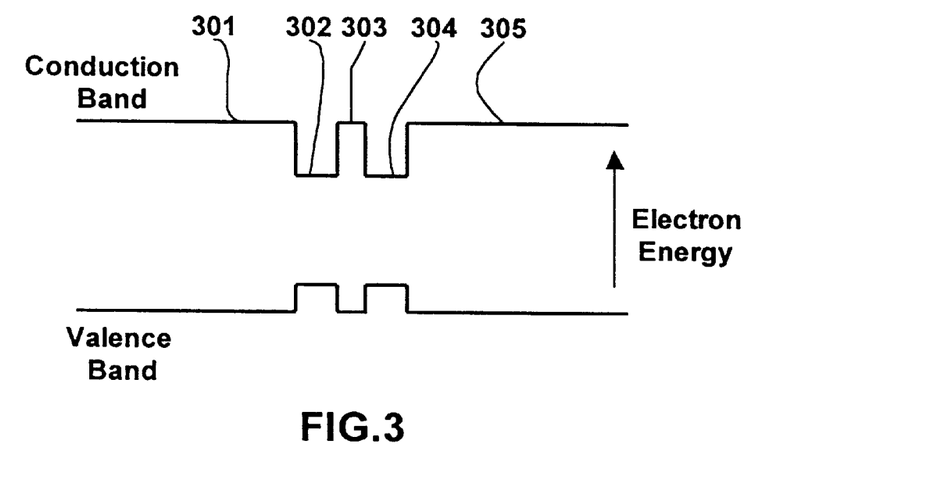
FIG. 3 is an energy band diagram illustrating a multilayer semiconductor structure applicable to the interband tunneling region and the two carrier oscillation regions for the semiconductor quantum oscillation device shown in FIG. 1.

FIG. 3 is an energy band diagram illustrating a multilayer semiconductor heterojunction structure applicable for interband tunneling region 102 and carrier oscillation regions 104 and 106 of semiconductor quantum oscillation device 100 shown in FIG. 1. In FIG. 3, a semiconductor layer 301 has a relatively larger bandgap, such as GaAlAs, and functions as hole oscillation region 106. A semiconductor layer 305 has a relatively larger bandgap, such as GaAlAs, and functions as electron oscillation region 104. For layer 301 and layer 305, the minimum bandgap could be either direct or indirect. When the bandgap is direct, as in the case of GaAlAs with the Al composition less than 0.45, the band diagram is a normal one with a conduction band-edge corresponding to electron energy which is minimum at the Brillouin zone center. When the bandgap is indirect, as in the case of GaAlAs with the Al composition higher than 0.45, the conduction band-edge in the band diagram still corresponds to electron energy at the Brillouin zone center though it is now not the minimum energy for the conduction band. Also shown in FIG. 3, are two semiconductor layers 302 and 304 with a relatively small band gap, such as GaAs, and another semiconductor layer 303 with a relatively large bandgap, such as GaAlAs. With layers 301 and 303 as the barriers and layer 302 as the thin potential well, a first quantum well is formed; and with layers 303 and 305 as the barriers and layer 304 as the thin potential well, a second quantum well is formed. A quantum well is a potential well having at least one discrete energy eigenstate, i.e. the allowed energy levels do not form a continuum. This is quite different from the case of ordinary double heterojunction structures where the allowed energy is continuous. In order to form a quantum well, the well layer must be very thin and at the same time a band-edge energy difference is needed between the quantum well layer and the barrier layers. For the barrier layer 303 sandwiched by the two quantum well layers 302 and 304, its bandgap could be either direct or indirect. However, its thickness must be thin enough to allow coupling between the two quantum wells, that is to form a coupled double quantum well. (About quantum wells, see e.g., (1) Special issue of Semiconductor Well and Superlattices; Physics and Applications of the IEEE Journal of Quantum Electronics, Vol. QE-22, September 1986; (2) E. E. Mendez and K. von Klitzing (1987), Physics and Applications of Quantum Wells and Superlattices, NATO ASI Series, Series B, Physics: 170, Plenum, N.Y.; (3) C. Weinbuch and B. Vinter, Quantum Semiconductor Structures, Academic press, 1991).

In FIG. 3, the region comprising layers 302, 303 and 304 is where a direct interband tunneling process takes place and can be termed "an interband tunneling injection region". Layers 301 and 305 act as the hole oscillation region and the electron oscillation region, respectively. When an external voltage is applied across the device, most of the voltage will be dropped across layers 301 and 305 and the band diagram shown in FIG. 3 will become tilted. By increasing the voltage it is possible to make the valence band-edge of quantum well 302 nearly line up with the conduction band-edge of quantum well 304. When this occurs, there is coupling between the valence electron energy levels of the first quantum well and the conduction electron levels of the second quantum well. This kind of coupling leads to some band-edge valence electrons of quantum well layer 302 entering into the conduction band of quantum well layer 304 through resonant interband tunneling without the involvement of phonons. As layers 301 and 305 have larger band gaps than quantum well layers 302 and 304, interband tunneling will not occur inside layers 301 and 305 for the electric field required to cause interband tunneling between quantum well layers 302 and 304. Therefore, only locally occurring interband tunneling is realized for the structure shown in FIG. 3. The electrons entering into the conduction band of quantum well layer 304 through interband tunneling will be further injected into electron oscillation region 305 as the strong electric field exists in the whole structure. Because all of the injected electrons originating from the valence band-edge of quantum well layer 302 have an initial wave vector of near zero and nearly identical real space positions, they are classical-like coherent electrons and meet the conditions required by Bloch oscillation. The holes left after interband tunneling in quantum well layer 302 are classical-like coherent holes and are injected into hole oscillation region 301. These injected hole also meet the conditions required by Bloch oscillation.

Figure 4:
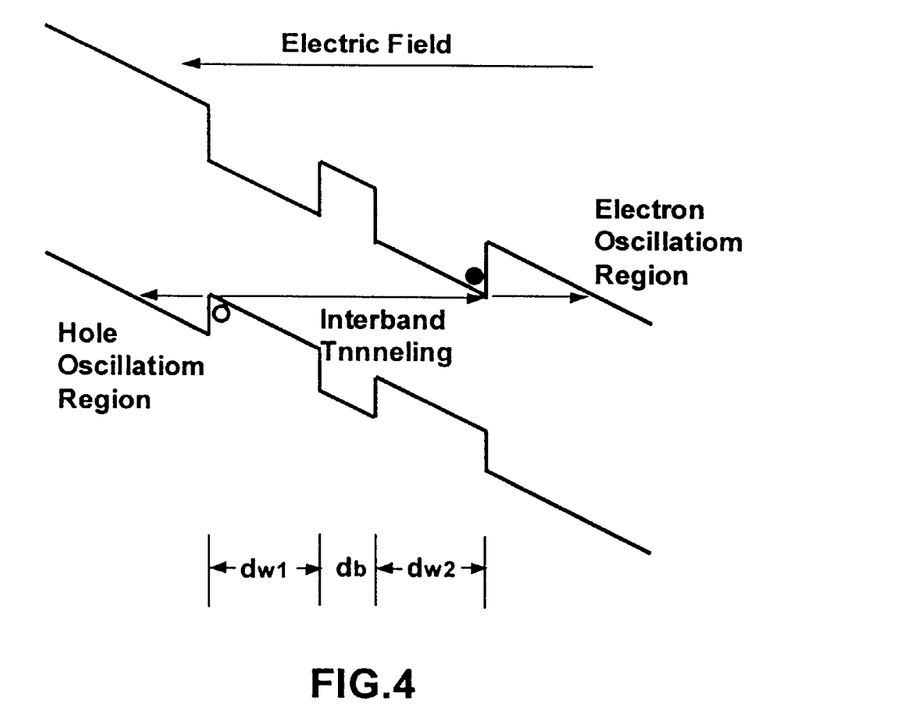
FIG. 4 is an energy band diagram for the interband tunneling region and carrier oscillation structure shown in FIG. 3, illustrating a situation where a critical voltage is applied to induce interband tunneling.

FIG. 4 is an energy band diagram for the interband tunneling region and carrier oscillation regions shown in FIG. 3 illustrating the situation where a critical voltage is applied to induce interband tunneling. Based on this figure, a critical electric field Ec could be defined. The operation of the semiconductor quantum oscillation device of the present invention requires that the electric field in the interband tunneling region and the two carrier oscillation regions produced by the applied voltage is higher than the critical electric field required to induce direct interband tunneling. The applied voltage corresponding to this critical electric filed is the critical voltage defined in FIG. 2. The critical electric field for the interband tunneling injection region and carrier oscillation region structure shown in FIG. 3 could be estimated by $$F_c = E_g / (d_{w1} + d_{w2} + d_b) \quad (2)$$

where $E_g$ is the band gap of the two quantum well layers (e.g. 302 and 304), $d_{w1}$ is the thickness of the first quantum well layer (e.g. 302), $d_{w2}$ is the thickness of the second quantum well layer (e.g. 304), and $d_b$ is the thickness of the thin barrier layer (e.g. 303).

Using semiconductor epitaxy techniques, GaAs/GaAlAs and GaInP/GaAs heterojunction material systems grown on a GaAs or Si substrate could be used to realized the structure having the band profile shown in FIG. 3. In addition, other heterojunction material systems could also be used, such as material systems InGaAs/InP, InGaAs/AlInAs and InGaAsP/InP grown on an InP substrate, or GaSb/GaAlSb material system grown on GaSb, AlSb or ZnTe substrates. At present, the growth of any of the above heterojunction systems by Molecular Beam Epitaxy (MBE), Metal Organic Chemical Vapor Deposition (MOCVD) and other methods is well known for those skill in the art, see e.g., L. L. Chang and K. Ploog, eds, Molecular Beam Epitaxy and Heterojunctions, Proc. Erice 1983 Summer school, martinus Nijhoff, 1985; and relevant articles in J. Crys. Growth.

Figure 5:
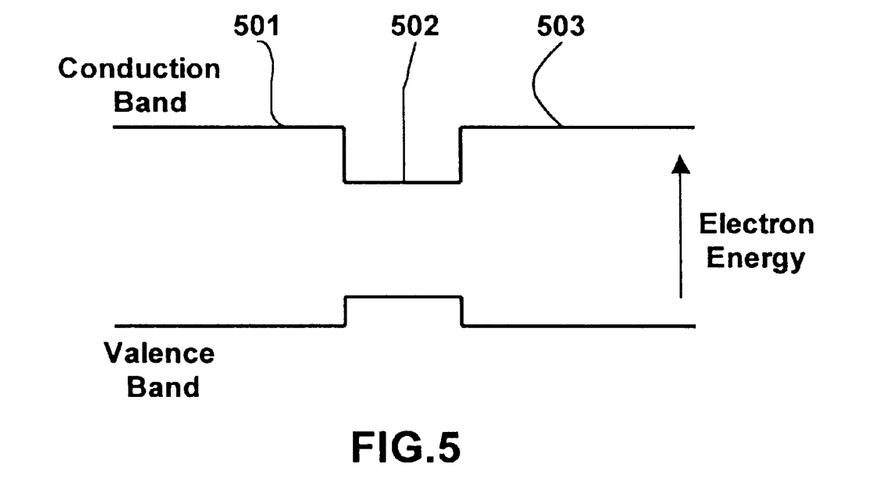
FIGS. 5–7 are energy band diagrams illustrating other usable interband tunneling region and carrier oscillation region structures for the semiconductor quantum oscillation device shown in FIG. 1.

FIG. 5 is an energy band diagram illustrating another multilayer semiconductor heterojunction applicable for the interband tunneling region and two carrier oscillation regions for the semiconductor quantum oscillation device shown in FIG. 1. The structure shown in FIG. 5 is very similar to the structure of FIG. 3, with the only difference being that a thicker single quantum well is used to replace the coupled double quantum well in FIG. 3. When the thin barrier layer 303 in FIG. 3 is replaced by the same material that the two quantum well layers is made of, layers 302, 303 and 304 will form a thick quantum well; and the structure shown in FIG. 5 is obtained. Under the action of a strong electric field produced by an applied voltage, for quantum well layer 502, the valence band-edge at the region near the interface with layer 501 could be brought into line with the conduction band-edge at the region near the interface with layer 503 (in order to keep agreement with FIG. 1, the electric field direction is assumed to point to layer 501 from layer 503, and in this case 501 and 503 form the hole and electron oscillation regions, respectively, and quantum well layer 502 forms the interband tunneling injection region). This band-edge line up between valence band and conduction band for the same quantum well layer will produce strong coupling between valence states and conduction states and leads to the occurrence of interband tunneling inside quantum well layer 502. As the electrons which undergone direct interband tunneling are initially located at the valence band edge in k space (k=0) and at the region near the interface with the hole oscillation region in real space, they are classical-like coherent electrons and meet the conditions required by Bloch oscillation. The coherent electrons are injected into electron oscillation region 503 and execute Bloch oscillation. The holes left in quantum well layer 502 after the direct interband tunneling are also classical-like coherent carriers and meet the conditions required by Bloch oscillation. The holes are injected into hole oscillation region 501 and execute Bloch oscillation there. The structure shown in FIG. 5 could also be realized using GaAs/GaAlAs, GaInP/GaAs, InGaAs/InP, InGaAs/AlInAs, InGaAsP/InP, GaSb/GaAlSb, or other semiconductor heterojunction systems.

Figure 6:
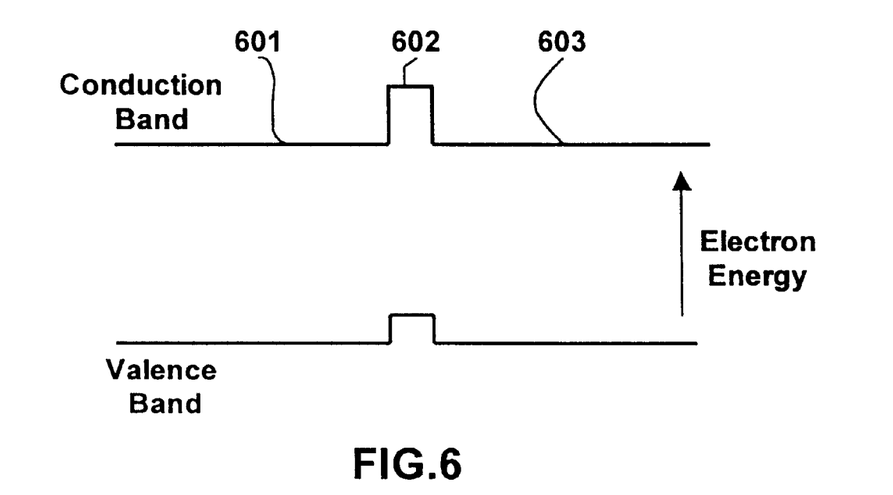

FIG. 6 is an energy band diagram illustrating yet another semiconductor structure usable for the interband tunneling region and two carrier oscillation regions for the semiconductor quantum oscillation device shown in FIG. 1. The structure comprises three semiconductor layers 601, 602 and 603, containing two heterojunctions of Type II band alignment. For the possible heterojunction band alignments, see e.g., S. M. Sze ed., High Speed Semiconductor Devices, John Wiley & Sons, P.20, 1990. For layer 602, the bandgap could be either direct or indirect, but it must be thin enough to form a hole quantum well. In order to keep agreement with FIG. 1, the electric field produced by the applied voltage is assumed to point in the direction from layer 603 to layer 601. Then layer 603 acts as the electron oscillation region, and layer 601 acts as the hole oscillation region. Under the action of the electric field, the valence band edge of the quantum well layer 602 at the region near the interface with layer 601 could be brought to line up with the conduction band edge of layer 603 at the region near the interface with layer 602. Then valence electrons of the quantum well layer will be injected into the electron oscillation region (layer 603) through direct interband tunneling, and the holes left will be injected into the hole oscillation region (layer 601). Injected electrons and holes obtained above also meet the conditions required by Bloch oscillation and will execute Bloch oscillation in the two carrier oscillation regions, respectively. The multilayer semiconductor heterojunction structure in FIG. 6 could be realized, for example, by using an AlInAs/InP heterojunction system grown on an InP substrate. The band alignment for this system is Type II with AlInAs having a higher valence edge. Therefore, AlInAs could be used for the quantum well layer 602, and InP could be used for the two oscillation regions 601 and 603. The band alignment between II–VI compounds ZeTe and CdSe is also a Type II. In this material system, ZnTe while having a higher valence band-edge could be used for the quantum well layer 602, and CdSe could be used for the two carrier oscillation regions.

Figure 7:
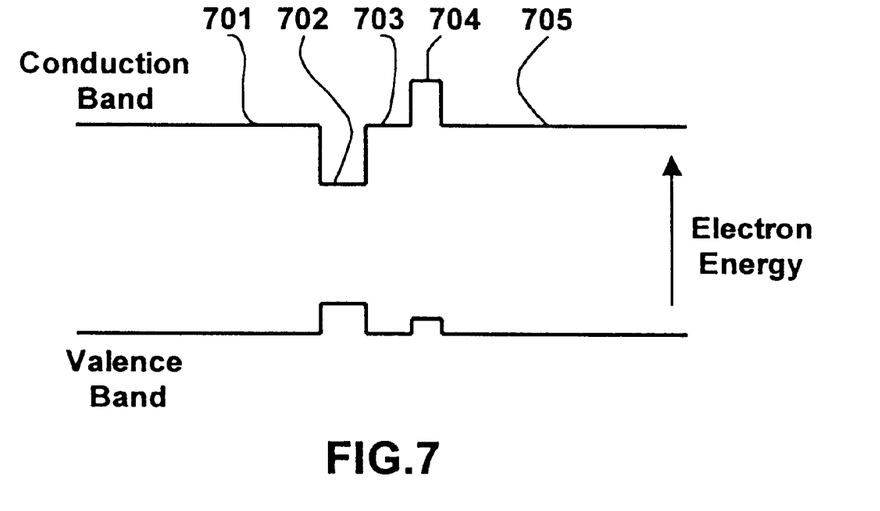

FIG. 7 is an energy band diagram illustrating still another multilayer semiconductor heterojunction structure usable for the interband tunneling region and two carrier oscillation regions for the semiconductor quantum oscillation device shown in FIG. 1. The structure of FIG. 7 comprises 5 semiconductor layers, where layers 701, 703 and 705 are made of the same semiconductor material, such as InP; layer 702 is made of another semiconductor material, such as InGaAs; and layer 704 is made of yet another semiconductor material, such as AlInAs. In this structure, the band alignment between 702 and 701 (and between 702 and 703) is Type I, and a first quantum well is formed with 702 as the well layer. The band alignment between 704 and 703 (and between 704 and 705) is Type II and a second hole quantum well is formed with 704 as the well layer. The hole well depth in the second quantum well should be shallower than that of the first quantum well. Supposing the electric field is in the direction from layer 705 to layer 701, then 701 will act as the hole oscillation region; 705 as the electron oscillation region; and 702, 703 and 704 together as the interband tunneling region. Under the action of a strong electric field, valence band-edge electrons of first quantum well layer 702 at the region near the interface with 701 can tunnel into layer 703 through direct interband tunneling and become conduction electrons. These electrons will be injected into the electron oscillation region 705 by further tunneling (intraband tunneling) through the thin barrier layer 704. The holes left in the quantum well layer 702 will be injected into the hole oscillation region 701 through valence-band intraband tunneling. The injected electrons and holes also meets the conditions required by Bloch oscillation and will execute oscillation motion in the two carrier oscillation regions, respectively. In this structure, layer 703 is used to form a thin conduction band barrier to increase the probability of valence electron interband tunneling from 702 to 704, and to this end the thickness of layer 703 should also be quite thin.

Figure 8:
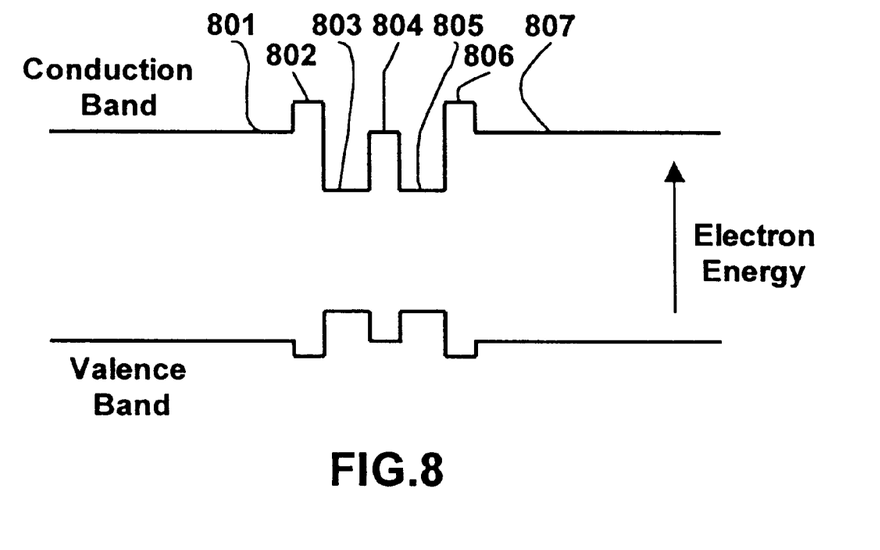
FIG. 8 is an energy band diagram illustrating another multilayer semiconductor structure applicable to the interband tunneling region and the two carrier oscillation regions for the semiconductor quantum oscillation device shown in FIG. 1, which is a modification of the structure shown in FIG. 3.

The carrier oscillation region for the multilayer semiconductor heterojunction structures shown in FIG. 3 and FIGS. 5–7 comprises only one uniform semiconductor layer. In fact, the carrier oscillation region could also be make to comprise several semiconductor layers with each layer not necessarily uniform (for example, the carrier oscillation region could be a composition gradient layer). The only requirement for the whole multilayer semiconductor heterojunction structure which comprises the interband tunneling injection region and the two carrier oscillation regions is that the structure supports direct interband tunneling which occurs first in the interband tunneling injection region. FIG. 8 is a multilayer semiconductor heterojunction structure usable for the interband tunneling injection region and the two carrier oscillation regions. In this structure, the electron oscillation region comprises two semiconductor layers 806 and 807, and the hole oscillation region also comprises two semiconductor layers 801 and 802. This structure also employs coupled double quantum wells as the interband tunneling injection region, similar to the structure in FIG. 3. The two quantum well layers are 803 and 805, and the thin electron penetrable barrier layer is 804. For this structure, by adjusting the thickness and bandgap of layer 802 and layer 806, the probability of direct interband tunneling could be enhanced due to the property of electron resonant tunneling. For a particular device, it is also possible that it may contain only one carrier oscillation region. This is accomplished by making the thickness of one carrier (either electron or hole) oscillation region smaller than the spatial amplitude of the respective Bloch oscillations. In an extreme example, the carrier oscillation region comprises multiple layers including a superlattice structure.

Figure 9:
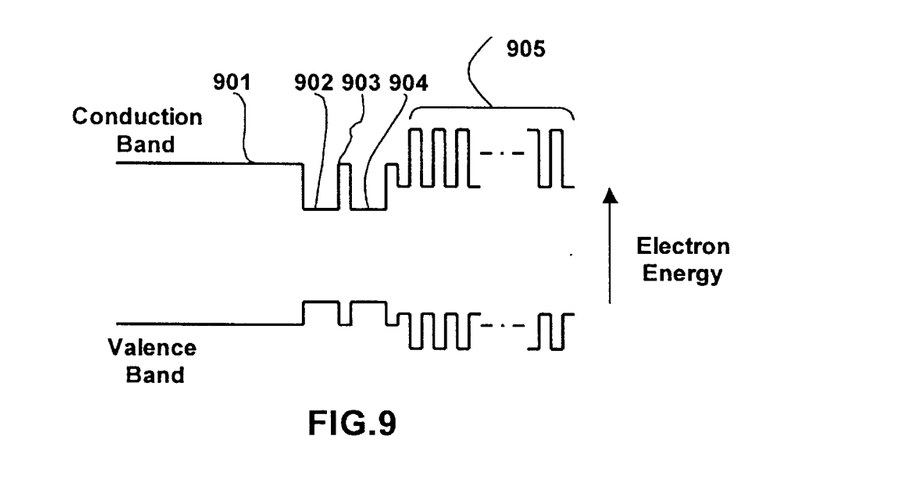
FIG. 9 is an energy band diagram for still another interband tunneling region and carrier oscillation region structure, in which the electron oscillation region comprises a superlattice structure.

FIG. 9 is an energy band diagram illustrating another multilayer semiconductor heterostructure usable for the interband tunneling region and two carrier oscillation regions shown in FIG. 1. In this structure the electron oscillation region comprises a superlattice structure 905, the hole oscillation region comprises a uniform semiconductor layer 901, and the interband tunneling injection region is a coupled double quantum well structure comprising layers 902, 903 and 904. The superlattice structure 905 comprises two semiconductor materials of different energy bandgap and has a period of d. In order to make direct interband tunneling take place in the interband tunneling injection region, the bandgap of the relatively small bandgap material in the superlattice structure should be not less than the bandgap of the two quantum well layers 902 and 904. The energy band offset between the two materials comprising the superlattice and their thickness determine the subband structure of the superlattice, and are important device design parameters. As the mini-Brillouin zone associated with the superlattice is smaller than the Brillouin zone of a bulk semiconductor, higher frequency electromagnetic radiation could be obtained by employing the superlattice as a carrier oscillation region for the same electric field.

For the semiconductor quantum oscillation device, strain could also be used to tailor the energy band structure to make direct interband tunneling more readily occur in the interband tunneling injection region. The energy band diagram in FIGS. 3–9 make no distinction between heavy hole valence bands (J=3/2, mz=3/2) and light hole valence bands (J=3/2, mz=1/2) for the top of the valence band. This is appropriate for the case where no strain exists in the multilayer semiconductor heterojunction structure. In this case, the heavy hole valence band and light hole valence band are degenerate at the band-edge. Strains remove this degeneracy. For biaxial tensile strained semiconductor layers, the light hole valence band becomes the highest valence band; and for biaxial compressive strained semiconductors, the heavy hole valence band becomes the highest valence band. Based on selection rule, only the light hole valence band is coupled with the conduction band under the electric field at the Brillouin zone center. It follows that direct interband tunneling will be favored by having the light hole valence band the highest valence band. To this end, a semiconductor strained layer epitaxy technique could be used to grow strained multilayer heterojunction structures to make direct interband tunneling processes more readily occur in the interband tunneling injection region. For the interband tunneling injection region and carrier oscillation regions, it is possible to make the whole structure biaxial tensile strained by using, for example, a GaAs/AlGaAs heterojunction material system grown on a Si substrate. For the same structure, if InGaAs/InP material grown on an InP substrate is used, it will be possible to make one or both quantum well layers biaxial tensile strained by adjusting the In composition of the InGaAs a little bit smaller than the lattice-match composition with InP (0.53). Biaxial tensile strain in a semiconductor epilayer is equivalent to the superposition of a hydrostatic compressive component and an axial tensile component, and the axial tensile component is in the epitaxy grown direction, that is parallel with the applied electric filed. Therefore, even for finished devices, it is still possible to make direct interband tunneling more readily occur by applying an external axial stress along the applied electric field direction.

In addition to using a strained layer to make direct interband tunneling more readily occur, another method to enhance performance of the semiconductor quantum oscillation device is to operate it at low temperature, such as at liquid nitrogen or even liquid helium temperatures. At a low temperature, the crystal vibration becomes weak and as a result phonon density is reduced. This will not only be beneficial to direct interband tunneling but also will reduce the non-elastic scattering of coherent carriers while executing Bloch oscillation.

Figure 10:
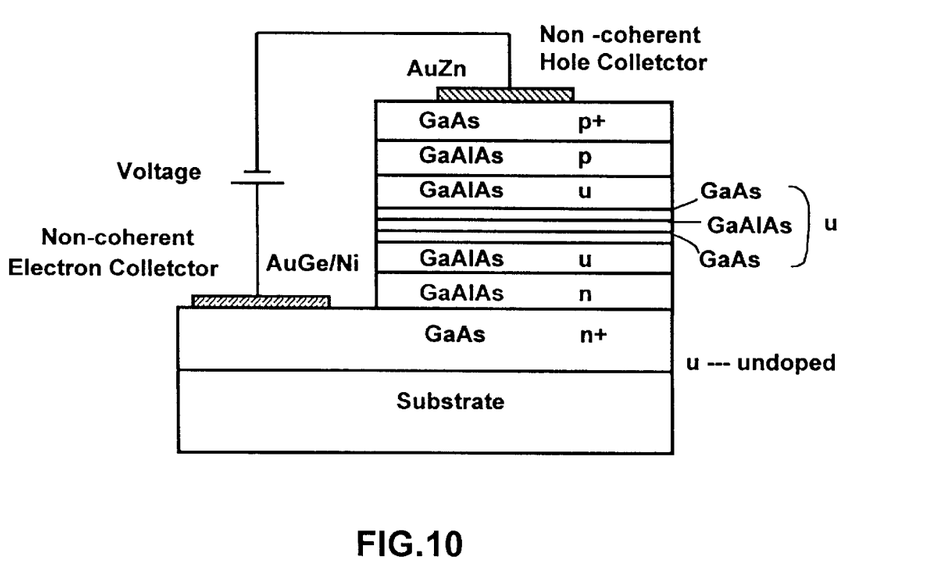
FIG. 10 is a sectional view of an exemplary device according to the subject invention.

FIG. 10 illustrates in cross-section an example of one device that can be used as a semiconductor quantum oscillation device of the present invention. In this embodiment, the whole device structure is made of GaAs/GaAlAs heterojunction material grown on a Si substrate using MBE, or the like. By using Si as the substrate, a biaxial tensile strained state is obtained for the device structure, and this is beneficial to direct interband tunneling. How strains affect interband tunneling has been described above. In order to reduce defects for the device structure, a thick buffer layer is grown first, then the device structure is grown on the buffer layer to finish the material growth. Device processing is similar to the fabrication of a mesa type photodiode, and includes photolithography, wet chemical etching, dielectric film deposition, metal evaporation, lift-off and alloying, and other steps. In the figure, u stands for undoped in the sense that there is no intentional dopant addition during layer growth; and the super script + with n and p stand for heavily doped. The interband tunneling injection region comprises two undoped GaAs layers and an undoped thin GaAlAs layer with these three layers forming a coupled double quantum well structure. The two GaAs layers forming the quantum well layers both have a thickness of approximately 100 angstroms. The thin GaAlAs layer, which defines one edge of the two quantum well structure, has a thickness of 50 angstrom and an Al composition of 0.2. The other two undoped layers, comprise GaAlAs and define the other edge of the two quantum well structure, which form the two carrier oscillation regions. Both layers have a thickness of 2000 angstrom and an Al composition of 0.4. In FIG. 10, the n-type contact region is made of the n-type GaAlAs layer and the heavily doped n-type GaAs layer; and the corresponding contact electrode, i.e. the non-coherent electron collector, is an ohmic contact formed on the heavily doped n-type GaAs layer. The p-type contact region is made of the p-type GaAlAs layer and the heavily doped p-type GaAs layer; and the corresponding contact electrode, i.e. the non-coherent hole collector, is an ohmic contact formed on the heavily doped p-type GaAs layer. The use of the heavily doped GaAs layer in the contact region is to increase the quality of the contact electrodes. Both the n-type GaAlAs layer and the p-type GaAlAs layer have a thickness of 2000 angstroms and an Al composition of 0.4, the same as the two undoped GaAlAs layers forming the two carrier oscillation regions. The main function of the n-type and p-type GaAlAs layers is to prevent the injection of non-coherent carriers from the two contact electrodes. A strong electric field in the interband tunneling injection region and the two carrier oscillation regions is required for the operation of the semiconductor quantum oscillation device of the present invention. As the electric field is originated from space charges in the contact regions, the above function could be well realized by confining the space charge region to the two doped GaAlAs layers. For the particular exemplary device of FIG. 10, $d_{w1}=d_{w2}=100$, $d_b=50$ Angstroms, and the bandgap of the GaAs quantum well layer $E_g=1.42$ (room temperature). The critical electric field calculated using equation (2) is $F_c=5.68\times10^5$ V/cm. In order to produce an electric field of this magnitude, an areal charge density of Fc $\in\in/q=3.6\times10^{12}/cm^2$ is required. As the two doped GaAlAs layers have a doping density of $5\times10^{17}/cm^2$, the resulting space charge region thickness is about 700 angstroms. Therefore, the 2000-angstrom thickness of these two layers is adequate to confine the space charge region within them.

The spatial amplitude of Bloch oscillations is given by $$L=\Delta E/eF \qquad (3)$$

where e is the electron charge, F is the electric field, and $\Delta E$ is the conduction band width of the electron oscillation region or the valence band width of the hole oscillation region in the direction of the electric field. In order to avoid scattering of Bloch oscillation by impurities in the contact region, the carrier oscillation regions should be designed having a larger thickness than the spatial amplitude calculated using (3) to confine the Bloch oscillation in the oscillation region. For GaAs and other common semiconductor materials, the bandwidth of the conduction band or the valence band along the <100> direction is normally in the range of 2–4 eV. For an electric field of $5.68\times10^5$ V/cm, the spatial amplitude calculated, based on equation (3), is between 400 to 800 Angstroms. It can be seen that a 2000-Angstrom oscillation region thickness in the exemplary device is adequate.

Figure 11:
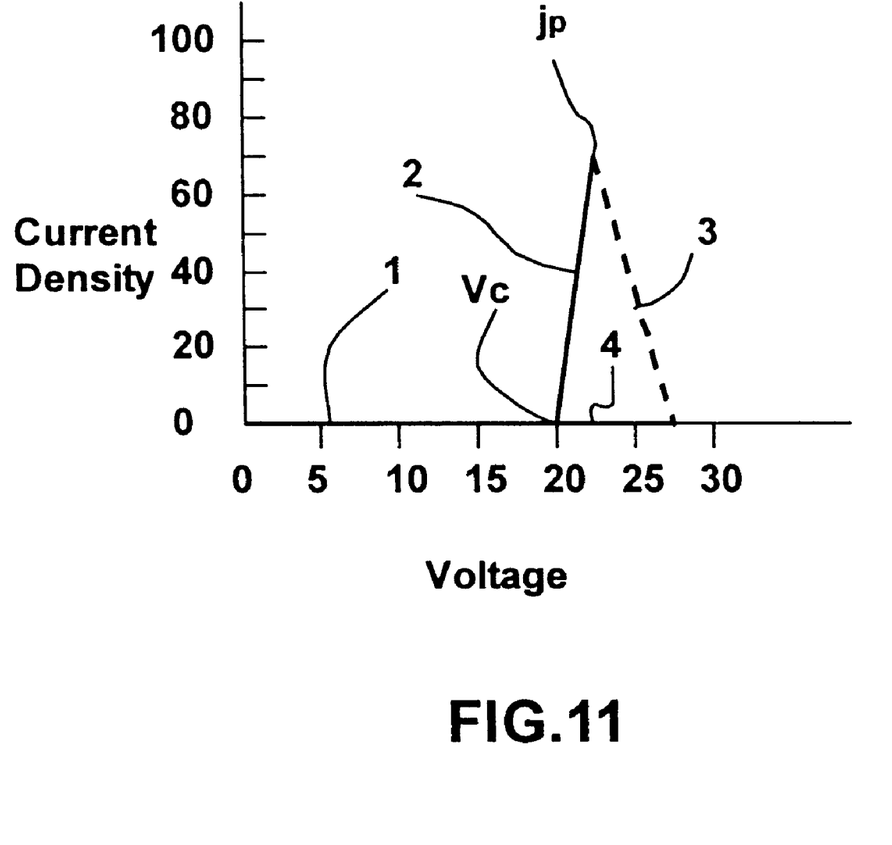
FIG. 11 is the I-V characteristics for the exemplary device shown in FIG. 10.

FIG. 11 is a plot of I-V characteristics obtained experimentally using a Transistor Curve Tracer (QT-2) for one typical device with the structure shown in FIG. 10. The two electrodes of the device to be tested are connected to the emitter terminal and collector terminal of the instrument, respectively, and the base terminal is not used. Measurement at liquid nitrogen temperature is also performed, and the I-V characteristics obtained are similar to FIG. 10 but with a higher peak current of about 300 A/cm². It can be seen that there is a critical voltage just like the I-V curve shown in FIG. 2, and the critical voltage has a value of about 20V. Based on the total thickness of the interband tunneling injection region and the two carrier oscillation regions and the critical electric field needed to induce direct interband tunneling, an estimate for the critical voltage could be made. For a critical electric field $Fc=5.68\times10^5$ v/cm, the voltage drop across the interband tunneling injection region and the two carrier oscillation regions (with a total thickness of 4500 angstrom) is 24.1V. Considering that a built-in potential drop, which is approximately equal to the band gap of GaAs (Eg=1.42), exists at equilibrium, the estimated critical voltage is 22.7V. It can be seen that the experimentally obtained critical voltage is in good agreement with the estimated voltage. The notable feature of the I-V curve shown in FIG. 11 is that there are two additional segments: the negative segment 3 and segment 4. These two segments are absent in the I-V curve of FIG. 2. While doing the measurements, it is also found that by increasing the peak value of the applied voltage (full-wave rectified sine wave), both the peak current jp and width of segment 4 increase accordingly. The above features demonstrate that the semiconductor quantum oscillation device of the present invention is different from all available semiconductor devices regarding operating principle, and that Bloch oscillation of interband tunneling injected carriers are indeed realized. As explained above, the coherent electrons and coherent holes injected into the two oscillation regions do not make a contribution to the terminal current while they execute Bloch oscillation. Therefore, both the positive-resistance segment 3 and negative-resistance segment 4 in FIG. 11 should be related to the dephased electrons and holes in the oscillation regions. Though the coherent electrons and coherent holes while executing Bloch oscillation do not contribute directly to the terminal current, they certainly influence the I-V characteristics of the device through the space-charge effect. The existence of negative-resistance segment 3 and the zero-current segment 4 in FIG. 11 and their dependence on the applied voltage is directly related to the following facts. Both the electron ensemble and hole ensemble are in a quasi-ordered state of far from thermal equilibrium and the electrons and holes while executing Bloch oscillation result in space-charge effects as they are localized in space.

The above description of the semiconductor quantum device of the present invention has explained in detail how the interband tunneling injection region and the two carrier oscillation regions could be realized using a multilayer semiconductor heterojunction structure having a predetermined band-gap and composition profile. It is needed to point out that all the structures given are by way of illustration and make no restriction on the scope of the subject invention. Those skilled in the art will appreciate that the disclosed semiconductor quantum oscillation device can be embodied using other types of band-gap profile and/or other semiconductor heterojunction material systems.

What is claimed is:

1. A semiconductor quantum oscillation device comprising:
   a multilayer structure of semiconductor heterojunction material defining an interband tunneling region with a pair of carrier oscillation regions sandwiching the interband tunneling region therebetween; and
   means for applying an operating voltage across the multilayer structure, the operating voltage inducing interband tunneling of carriers in the interband tunneling region and injecting coherent carriers into the carrier oscillation regions.

2. A semiconductor quantum oscillation device as claimed in claim 1 wherein the semiconductor heterojunction material is intrinsic semiconductor material.

3. A semiconductor quantum oscillation device as claimed in claim 1 wherein the pair of carrier oscillation regions include an electron oscillation region and a hole oscillation region.

4. A semiconductor quantum oscillation device as claimed in claim 1 wherein the means for applying the operating voltage includes a pair of semiconductor contact regions sandwiching the carrier oscillation regions therebetween.

5. A semiconductor quantum oscillation device as claimed in claim 4 wherein the pair of semiconductor contact regions are n-type conductivity and p-type conductivity.

6. A semiconductor quantum oscillation device as claimed in claim 4 wherein the means for applying the operating voltage further includes a pair of metal electrodes sandwiching the pair of semiconductor contact regions.

7. A semiconductor quantum oscillation device as claimed in claim 6 wherein each metal electrode of the pair of metal electrodes is connected to one contact region of the pair of semiconductor contact regions by an ohmic contact.

8. A semiconductor quantum oscillation device as claimed in claim 1 wherein the interband tunneling region and the pair of carrier oscillation regions have a composition and bandgap profile such that an electric field across the interband tunneling region and the pair of carrier oscillation regions produced by the operating voltage is at least equal to a critical electric field required to induce direct interband tunneling.

9. A semiconductor quantum oscillation device as claimed in claim 1 wherein at least one of the pair of carrier oscillation regions includes a superlattice structure.

10. A semiconductor quantum oscillation device as claimed in claim 1 wherein the interband tunneling region includes a coupled double quantum well structure having two opposed outside barrier regions defining outer boundaries of the coupled double quantum well structure, the two opposed outside barrier regions defining the pair of carrier oscillation regions.

11. A semiconductor quantum oscillation device as claimed in claim 10 wherein the coupled double quantum well structure further includes an electron-penetrable barrier layer sandwiched between a pair of quantum well layers and the two opposed outside barrier regions sandwiching the pair of quantum well layers.

12. A semiconductor quantum oscillation device as claimed in claim 10 wherein at least one of the pair of quantum well layers is under bi-axial tensile stress.

13. A semiconductor quantum oscillation device as claimed in claim 1 including a resonant cavity for far-infrared radiation.

14. A semiconductor quantum oscillation device comprising:
   a multilayer structure of intrinsic semiconductor heterojunction material defining an interband tunneling region with a pair of carrier oscillation regions sandwiching the interband tunneling region therebetween, the pair of carrier oscillation regions including an electron oscillation region and a hole oscillation region; and
   voltage means for applying an operating voltage across the multilayer structure, the voltage means including a pair of semiconductor contact regions sandwiching the carrier oscillation regions and a pair of metal electrodes sandwiching the pair of semiconductor contact regions, the operating voltage inducing interband tunneling of carriers in the interband tunneling region and injecting coherent carriers into the carrier oscillation regions whereby Bloch oscillations occur in the carrier oscillation regions.

15. A semiconductor quantum oscillation device as claimed in claim 14 wherein the interband tunneling region and the pair of carrier oscillation regions have a composition and bandgap profile such that an electric field across the interband tunneling region and the pair of carrier oscillation regions produced by the operating voltage is at least equal to a critical electric field required to induce direct interband tunneling.

16. A semiconductor quantum oscillation device as claimed in claim 14 wherein at least one of the pair of carrier oscillation regions includes a superlattice structure.

17. A semiconductor quantum oscillation device as claimed in claim 14 wherein the interband tunneling region includes a coupled double quantum well structure having two opposed outside barrier regions defining outer boundaries of the coupled double quantum well structure, the two opposed outside barrier regions defining the pair of carrier oscillation regions.

18. A semiconductor quantum oscillation device as claimed in claim 17 wherein the coupled double quantum well structure further includes an electron-penetrable barrier layer sandwiched between a pair of quantum well layers and the two opposed outside barrier regions sandwiching the pair of quantum well layers.

19. A semiconductor quantum oscillation device as claimed in claim 17 wherein at least one of the pair of quantum well layers is under bi-axial tensile stress.

20. A method of producing Bloch oscillations in a semiconductor quantum oscillation device comprising the steps of:
   providing a multilayer structure of semiconductor heterojunction material defining an interband tunneling region with a pair of carrier oscillation regions sandwiching the interband tunneling region therebetween; and
   applying an operating voltage across the multilayer structure such that the operating voltage induces interband tunneling of carriers in the interband tunneling region and coherent carriers are injected into the carrier oscillation regions.

21. A method of producing Bloch oscillations in a semiconductor quantum oscillation device as claimed in claim 15 wherein the step of providing the multilayer structure of semiconductor heterojunction material defining the interband tunneling region and the pair of carrier oscillation regions includes providing the structure with a composition and bandgap profile such that an electric field across the interband tunneling region and the pair of carrier oscillation regions produced by the application of the operating voltage is at least equal to a critical electric field required to induce direct interband tunneling.

22. A method of producing Bloch oscillations in a semiconductor quantum oscillation device as claimed in claim 20 wherein the step of applying an operating voltage includes creating an electric field across the interband tunneling region and the pair of carrier oscillation regions which is at least equal to a critical electric field required to induce direct interband tunneling.

23. A method of producing Bloch oscillations in a semiconductor quantum oscillation device comprising the steps of:

provi­ding a multilayer structure of semiconductor heterojunction material defining an interband tunneling region with a pair of carrier oscillation regions sandwiching the interband tunneling region therebetween; and injecting coherent carriers into the carrier oscillation regions, whereby Bloch oscillations occur in the carrier oscillation regions.

24. A method of producing Bloch oscillations in a semiconductor quantum oscillation device as claimed in claim 23 wherein the step of injecting coherent carriers includes creating an electric field across the interband tunneling region and the pair of carrier oscillation regions which is at least equal to a critical electric field required to induce direct interband tunneling.

* * * * *